(12) United States Patent
Kim et al.

(10) Patent No.: US 10,958,239 B2
(45) Date of Patent: Mar. 23, 2021

(54) BULK ACOUSTIC WAVE RESONATOR

(71) Applicant: Samsung Electro-Mechanics Co., Ltd, Suwon-si (KR)

(72) Inventors: Tae Yoon Kim, Suwon-si (KR); Moon Chul Lee, Suwon-si (KR); Yoon Sok Park, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 416 days.

(21) Appl. No.: 15/797,224

(22) Filed: Oct. 30, 2017

(65) Prior Publication Data

US 2018/0309427 A1 Oct. 25, 2018

(30) Foreign Application Priority Data

Apr. 19, 2017 (KR) ........................ 10-2017-0050609

(51) Int. Cl.
*H03H 9/10* (2006.01)
*H03H 3/02* (2006.01)
*H03H 9/02* (2006.01)
*H03H 9/17* (2006.01)

(52) U.S. Cl.
CPC ............ *H03H 9/1014* (2013.01); *H03H 3/02* (2013.01); *H03H 9/02047* (2013.01); *H03H 9/02118* (2013.01); *H03H 9/02133* (2013.01); *H03H 9/02157* (2013.01); *H03H 9/173* (2013.01); *H03H 2003/021* (2013.01)

(58) Field of Classification Search
CPC ............. H03H 9/173; H03H 2003/021; H03H 9/0504; H03H 9/02133; H03H 9/1014; H03H 9/021118
See application file for complete search history.

(56) References Cited

U.S. PATENT DOCUMENTS

| 7,321,183 | B2 | 1/2008 | Ebuchi et al. | |
|---|---|---|---|---|
| 2003/0030118 | A1* | 2/2003 | Kim | H03H 3/04 257/414 |
| 2004/0113720 | A1* | 6/2004 | Komuro | H03H 9/175 333/133 |
| 2005/0142888 | A1* | 6/2005 | Ebuchi | H03H 9/02133 438/738 |
| 2008/0024041 | A1* | 1/2008 | Shibata | H03H 3/04 310/340 |

(Continued)

FOREIGN PATENT DOCUMENTS

KR   10-2012-0023285 A   3/2012

OTHER PUBLICATIONS

IP search for U.S. Appl. No. 15/797,224 (Year: 2021).*

*Primary Examiner* — Bryan P Gordon
(74) *Attorney, Agent, or Firm* — NSIP Law

(57) ABSTRACT

A bulk acoustic wave resonator includes: support members disposed between air cavities; a resonant part including a first electrode, a piezoelectric layer, and a second electrode sequentially disposed above the air cavities and on the support members; and a wiring electrode connected either one or both of the first electrode and the second electrode, and disposed above one of the air cavities, wherein a width of an upper surface of the support members is greater than a width of a lower surface of the support members, and side surfaces of the support members connecting the upper surface and the lower surface to each other are inclined.

8 Claims, 9 Drawing Sheets

(56) References Cited

U.S. PATENT DOCUMENTS

| | | |
|---|---|---|
| 2008/0081398 A1 | 4/2008 | Lee et al. |
| 2012/0049976 A1 | 3/2012 | Son et al. |
| 2013/0181579 A1* | 7/2013 | Shin ...................... H01L 41/107 310/346 |
| 2013/0193808 A1* | 8/2013 | Feng ...................... H03H 9/173 310/360 |
| 2017/0317660 A1* | 11/2017 | Kim ...................... H03H 9/173 |

* cited by examiner

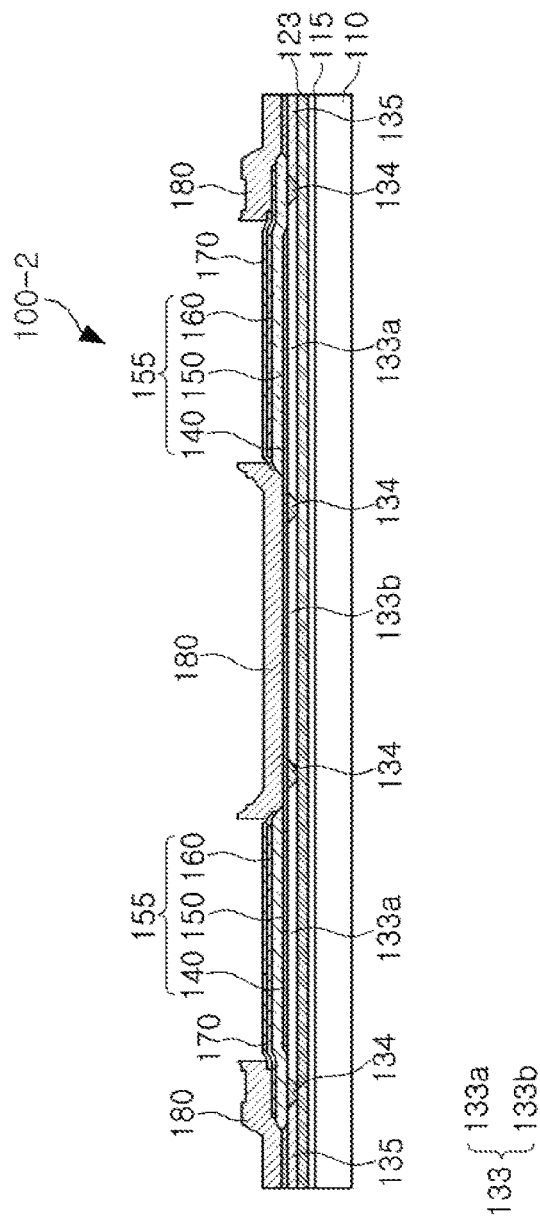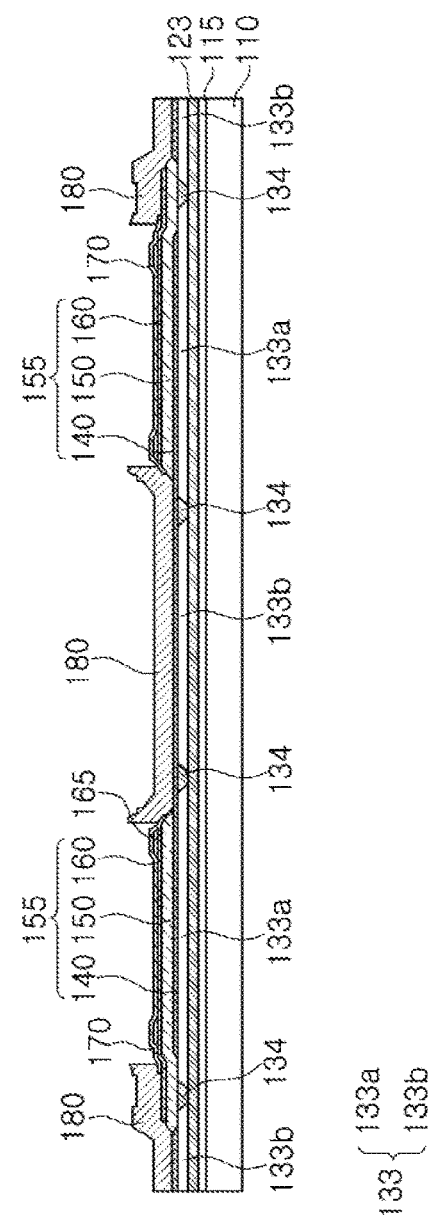

A

BULK ACOUSTIC WAVE RESONATOR

CROSS-REFERENCE TO RELATED APPLICATIONS

This application claims the benefit under 35 U.S.C. § 119(a) of Korean Patent Application No. 10-2017-0050609 filed on Apr. 19, 2017 in the Korean Intellectual Property Office, the entire disclosure of which is incorporated herein by reference for all purposes.

BACKGROUND

1. Field

The following description relates to a bulk acoustic wave resonator.

2. Description of Related Art

Recently, in accordance with the rapid development of mobile communications devices, and chemical and biological devices, a demand for a small and light filter, an oscillator, a resonant element, and an acoustic resonant mass sensor, used in these devices has also increased.

A film bulk acoustic resonator (FBAR) has been known as a member implementing the small and light filter, the oscillator, the resonant element, and the acoustic resonant mass sensor. The film bulk acoustic wave resonator may be mass-produced at a minimal cost, and may be implemented to have a subminiature size. In addition, the FBAR may provide a high quality factor (Q) value, a main characteristic of a filter, may be used even in a microwave frequency band, and may implement particular bands of a personal communications system (PCS) and a digital cordless system (DCS).

In general, a FBAR includes a resonant part implemented by sequentially stacking a first electrode, a piezoelectric layer, and a second electrode on a substrate. In operation of the FBAR, an electric field is induced in the piezoelectric layer by electrical energy applied to the first and second electrodes, and a piezoelectric phenomenon occurs in the piezoelectric layer by the induced electric field, such that the resonant part vibrates in a predetermined direction. As a result, a bulk acoustic wave is generated in the same direction as the direction in which the resonant part vibrates, resulting in resonance.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk acoustic wave resonator includes: support members disposed between air cavities; a resonant part including a first electrode, a piezoelectric layer, and a second electrode sequentially disposed above the air cavities and on the support members; and a wiring electrode connected either one or both of the first electrode and the second electrode, and disposed above one of the air cavities, wherein a width of an upper surface of the support members is greater than a width of a lower surface of the support members, and side surfaces of the support members connecting the upper surface and the lower surface to each other are inclined.

The bulk acoustic wave resonator may further include a frame extending in each of the air cavities, along a boundary surface of the resonant part.

The support members may be formed of either one or both of a silicon dioxide and a silicon nitride.

The frame may protrude from a support member, among the support members.

The frame may be spaced apart from a support member, among the support members.

The frame may be formed of a material including either one or both of a tensile stress and a compressive stress.

The frame and the resonant part may have temperature coefficients of elasticity of which signs are different from each other.

The bulk acoustic wave resonator may further include an auxiliary support member disposed in the one of the air cavities.

The auxiliary support member and the support members may be formed of a same material.

The auxiliary support member may include polysilicon.

In another general aspect, a bulk acoustic wave resonator includes: support members disposed between air cavities; a resonant part including a first electrode, a piezoelectric layer, and a second electrode sequentially disposed on a surface above the air cavities and on the support members; a wiring electrode connected to either one or both of the first electrode and the second electrode, and disposed above one of the air cavities; an auxiliary support member disposed in the one of the air cavities; and a connection pattern disposed in a via hole penetrating through the auxiliary support member, wherein the connection pattern is connected to the first electrode and the second electrode, and supports either one or both of the first electrode and the second electrode.

The connection pattern may be formed on an inner wall of the via hole.

The bulk acoustic wave resonator may further include a frame extending in each of the air cavities, along a boundary surface of the resonant part.

The frame may protrude from a support member, among the support members.

A thickness of the frame may be less than a thickness of the support member.

The frame may be spaced apart from a support member, among the support members.

The support members may be formed of either one or both of a silicon dioxide and a silicon nitride.

The frame may be formed of either one or both of a silicon dioxide and a silicon nitride.

Other features and aspects will be apparent from the following detailed description, the drawings, and the claims.

BRIEF DESCRIPTION OF DRAWINGS

FIGS. 3 through 8 are cross-sectional views illustrating bulk acoustic wave resonators, according to various embodiments.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
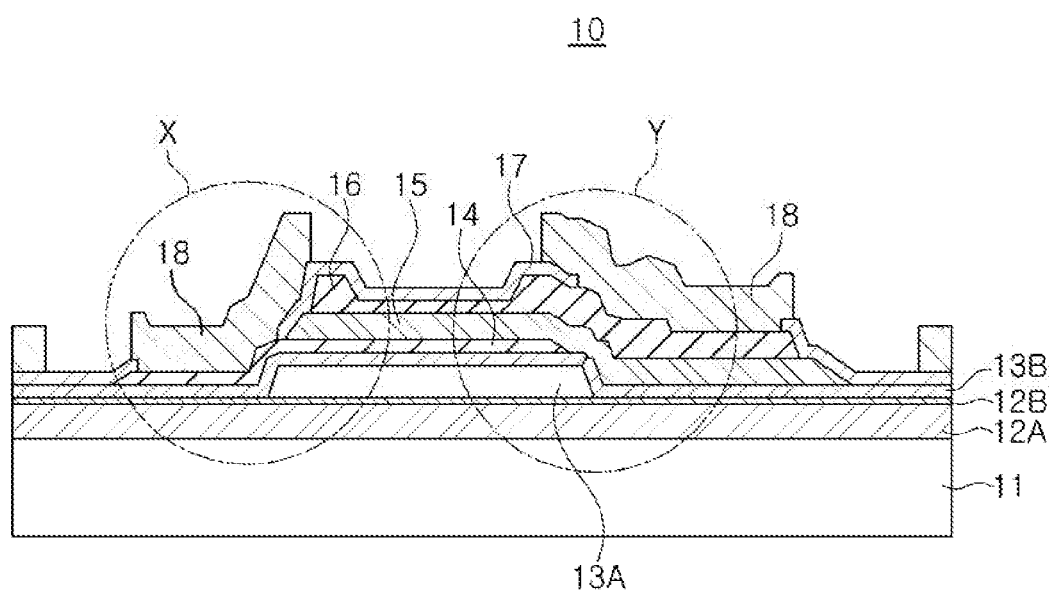
FIG. 1 is a cross-sectional view illustrating an example of a bulk acoustic wave resonator.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," "coupled to," "over," or "covering" another element, it may be directly "on," "connected to," "coupled to," "over," or "covering" the other element, or there may be one or more other elements intervening therebetween. In contrast, when an element is described as being "directly on," "directly connected to," "directly coupled to," "directly over," or "directly covering" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Hereinafter, embodiments will be described in detail with reference to the accompanying drawings.

Figure 2A:
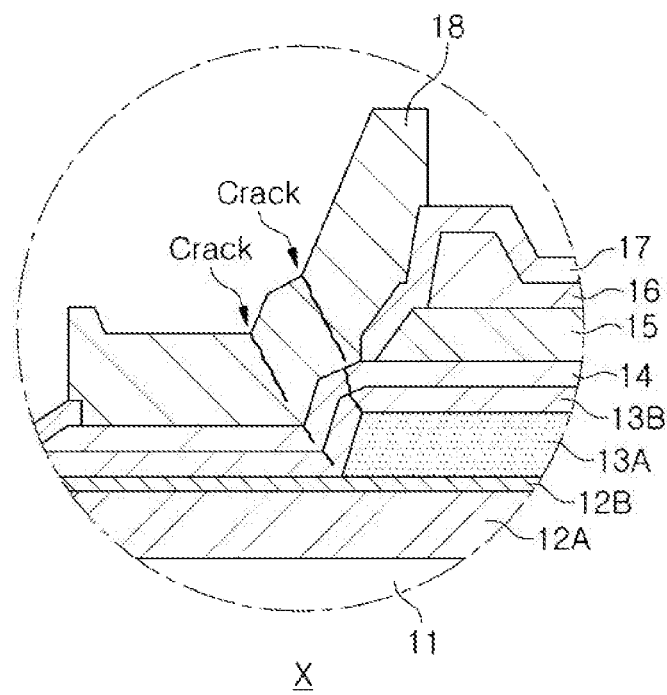
FIGS. 2A and 2B are partially enlarged views of the bulk acoustic wave resonator of FIG. 1.
Figure 2B:
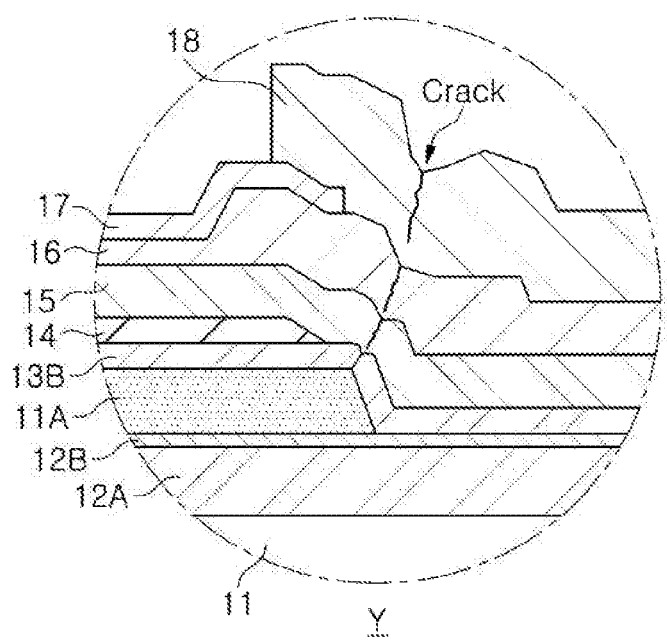

FIG. 1 is a cross-sectional view illustrating an example of a bulk acoustic wave resonator 10. FIGS. 2A and 2B are partially enlarged views of the bulk acoustic wave resonator 10.

Referring to FIG. 1, the bulk acoustic wave resonator 10 includes a substrate 11, an insulating layer 12A electrically isolating the substrate 11, an etch stop layer 12B configured to protect the insulating layer 12A from an etching process, an air cavity 13A formed on the etch stop layer 12B, a membrane 13B covering the air cavity 13A, and a lower electrode 14, a piezoelectric layer 15, and an upper electrode 16 sequentially stacked on the membrane 13B. In addition, the bulk acoustic wave resonator 10 includes a protecting layer 17 preventing the upper electrode 16 from being externally exposed, and a wiring electrode 18 connected to the lower electrode 14 and the upper electrode 16.

The air cavity 13A is positioned below a resonant part including the lower electrode 14, the piezoelectric layer 15, and the upper electrode 16 so that the resonant part vibrates in a predetermined direction. The air cavity 13A may be formed by forming a sacrificial layer on the etch stop layer 12B, forming the membrane 13B on the sacrificial layer, and then removing the sacrificial layer using an etching process.

The air cavity 13A has an approximately trapezoidal shape. Referring to FIGS. 2A and 2B, cracks may be formed in the lower electrode 14, the piezoelectric layer 15, the upper electrode 16, and the wiring electrode 18 stacked on the membrane 13B due to a height of the air cavity 13A and an angle of side surfaces of the air cavity 13A in regions X and Y of FIG. 1. In addition, crystals of the piezoelectric layer 15 stacked on the membrane 13B may be abnormally grown. Due to the cracks and the abnormal crystal growth, insertion loss characteristics and attenuation characteristics of the bulk acoustic wave resonator 10 may be deteriorated.

FIGS. 3 through 8 are cross-sectional views illustrating bulk acoustic wave resonators, according to various embodiments. Since the bulk acoustic wave resonators according to the embodiments of FIGS. 3 through 8 are similar to one another, the bulk acoustic wave resonator according to the embodiment of FIG. 3 will be primarily described, and a description of contents that are the same as or overlap those of the bulk acoustic wave resonator of FIG. 3 in the bulk acoustic wave resonators of FIGS. 4 through 8 will be omitted, and contents that are different from those of the bulk acoustic wave resonator of FIG. 3 will be described in detail.

A bulk acoustic wave resonator according to the embodiments described herein is, for example, a film bulk acoustic resonator (FBAR).

Figure 3:
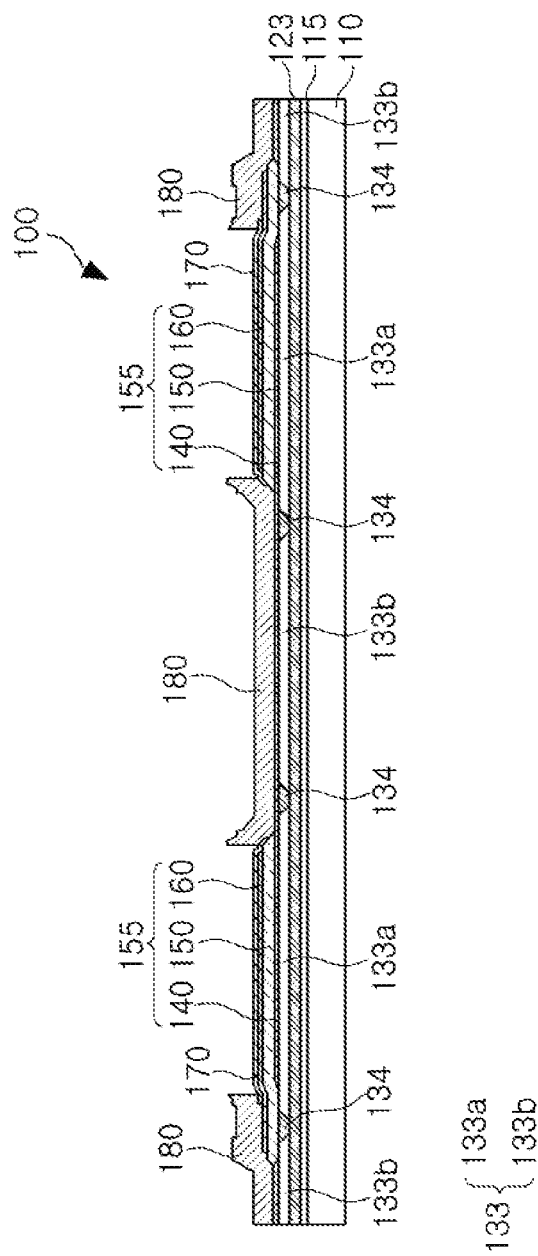
Figure 4:
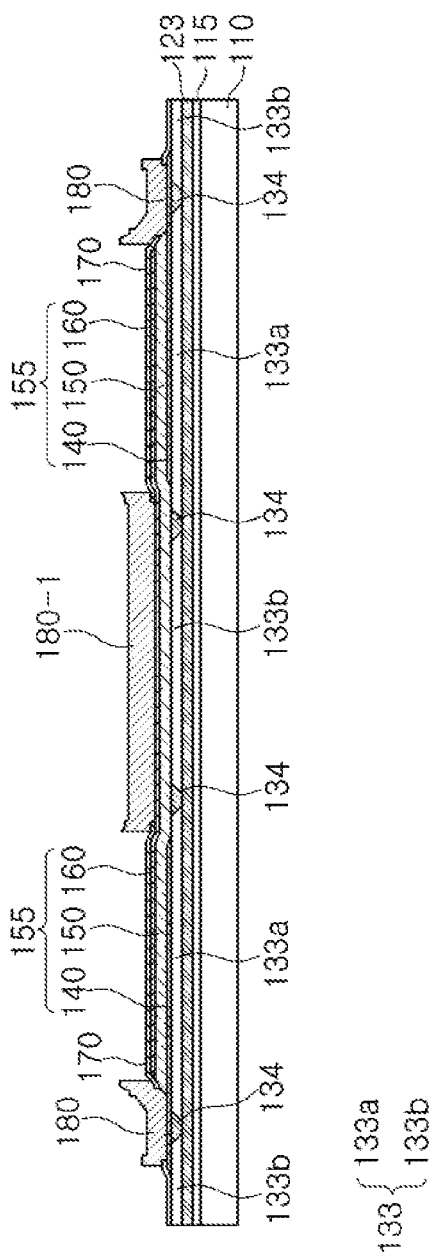

Referring to FIG. 3, a bulk acoustic wave resonator 100 includes a substrate 110, an insulating layer 115, an etch stop layer 123, air cavities 133, support members 134, and resonant parts 155 including a first electrode 140, a piezoelectric layer 150, and a second electrode 160. The bulk acoustic wave resonator 100 further includes a protecting layer 170 and a wiring electrode 180.

The substrate 110 may be a silicon substrate, and the insulating layer 115, which electrically isolates the resonant parts 155 from the substrate 110, is provided on an upper surface of the substrate 110. The insulating layer 115 may be formed on the substrate 110 by performing chemical vapor deposition, radio frequency (RF) magnetron sputtering, or evaporation of a silicon dioxide ($SiO_2$) or an aluminum oxide ($Al_2O_3$).

The etch stop layer 123 is formed on the insulating layer 115. The etch stop layer 123 protects the substrate 110 and the insulating layer 115 from an etching process, and may be a base required for depositing layers or films on the etch stop layer 123. The insulating layer 115 and the etch stop layer 123 are separated from each other in FIG. 3, but the insulating layer 115 and the etch stop layer 123 may be integrated with each other as a single layer. In a case in which the insulating layer 115 and the etch stop layer 123 are integrated with each other as a single layer, the insulating layer 115 and the etch stop layer 123 may be integrated with each other using an oxide layer.

The air cavities 133 and the support members 134 are formed on the etch stop layer 123.

The air cavities 133 are formed, for example, by forming a sacrificial layer on the etch stop layer 123, forming patterns for providing the support members 134 on the sacrificial layer, stacking the first electrode 140, the piezoelectric layer 150, and the second electrode 160, and then etching and removing the sacrificial layer by an etching process. As an example, the sacrificial layer includes polysilicon (poly-Si).

The air cavity 133 includes a first air cavity 133a and a second air cavity 133b. The first air cavity 133a is positioned below the resonant part 155 including the first electrode 140, the piezoelectric layer 150, and the second electrode 160 so that the resonant part 155 vibrates in a predetermined direction. The second air cavity 133b is disposed below the wiring electrode 180. The second air cavity 133b is provided below the wiring electrode 180 to reduce a parasitic capacitance component due to an intrinsic dielectric constant of the sacrificial layer remaining before the second air cavity 133b is formed. In FIG. 3, the second air cavity 133b is provided below the wiring electrode 180 that connects between the first electrodes 140 of adjacent bulk acoustic wave resonators 100. According to another embodiment illustrated in FIG. 4, a bulk acoustic wave resonator 100-1 includes the cavity 133b provided below a wiring electrode 180-1 that connects between the second electrodes 160 of adjacent bulk acoustic wave resonators 100-1.

Referring back to FIG. 3, in the bulk acoustic wave resonator 100, the support member 134 is provided between the first air cavity 133a and the second air cavity 133b.

The support member 134 may have the same thickness as that of the air cavity 133. Therefore, an upper surface provided by the air cavity 133 and the support member 134 may be approximately flat. The resonant part 155 is disposed on a flat surface from which a step is removed, resulting in improvement of insertion loss characteristics and attenuation characteristics of the bulk acoustic wave resonator 100.

A cross section of the support member 134 has, for example, an approximately trapezoidal shape. For example, a width of an upper surface of the support member 134 is greater than a width of a lower surface of the support member 134, and side surfaces of the support member 134 connecting the upper surface and the lower surface to each other are inclined. The support member 134 may be formed of a material that is not etched in an etching process for removing the sacrificial layer. As an example, the support member 134 is formed of the same material as that of the etch stop layer 123. For example, the support member 134 is formed of either one or both of a silicon dioxide ($SiO_2$) and a silicon nitride ($Si_3N_4$).

Referring to FIG. 5, in a bulk acoustic wave resonator 100-2, auxiliary support members 135 are provided outside the support members 134. As an example, the auxiliary support members 135 are provided in some regions of second air cavities 133b. The regions in which the auxiliary support members 135 are provided may be determined according to an influence of a parasitic capacitance component depending on a length of the wiring electrode 180.

The auxiliary support member 135 may be formed of the same material as that of the support member 134 or be formed of a material different from that of the support member 134. As an example, when the auxiliary support member 135 is formed of the material different from that of the support member 134, the auxiliary support member 135 corresponds to a portion remaining after the etching process in the sacrificial layer formed on the etch stop layer 123. The configuration of the auxiliary support member 135 of the bulk acoustic wave resonator 100-2 may be variously applied to other embodiments disclosed herein.

Referring back to FIG. 3, in the bulk acoustic wave resonator 100, the resonant part 155 includes the first electrode 140, the piezoelectric layer 150, and the second electrode 160. A common region in which the first electrode 140, the piezoelectric layer 150, and the second electrode 160 overlap one another in a vertical direction is positioned above the first air cavity 133a. The first electrode 140 and the second electrode 160 may be formed of any one of gold (Au), titanium (Ti), tantalum (Ta), molybdenum (Mo), ruthenium (Ru), platinum (Pt), tungsten (W), aluminum (Al), iridium (Ir), and nickel (Ni), or alloys thereof. The piezoelectric layer 150, which generates a piezoelectric effect that electric energy is converted into mechanical energy having an elastic wave form, may be formed of any one of an aluminum nitride (AlN), a zinc oxide (ZnO), and a lead zirconium titanium oxide (PZT; PbZrTiO). In addition, the piezoelectric layer 150 may further include a rare earth metal. As an example, the rare earth metal includes any one or any combination of any two or more of scandium (Sc), erbium (Er), yttrium (Y), and lanthanum (La). The piezoelectric layer 150 may include 1 to 20 at % of rare earth metal.

A seed layer for improving crystal alignment of the piezoelectric layer 150 may be additionally provided below the first electrode 140. The seed layer may be formed of one of an aluminum nitride (AlN), a zinc oxide (ZnO), and a lead zirconium titanium oxide (PZT; PbZrTiO) having the same crystallinity as that of the piezoelectric layer 150. In addition, a membrane adjusting stress of the bulk acoustic wave resonator may be additionally provided below the first electrode 140. As an example, the membrane includes a silicon nitride (SiN).

The protecting layer 170 is disposed on the second electrode 160 to prevent the second electrode 160 from being externally exposed. The protecting layer 170 may be formed of any one of a silicon oxide based insulating material, a silicon nitride based insulating material, and an aluminum nitride based insulating material. The wiring electrode 180 is formed on externally exposed portions of the first electrode 140 and the second electrode 160.

The resonant part 155 includes an active region and an inactive region. The active region of the resonant part 155, which is a region vibrating and resonating in a predetermined direction due to a piezoelectric phenomenon generated in the piezoelectric layer 150 when electric energy such as a radio frequency signal is applied to the first electrode 140 and the second electrode 160, corresponds to a region in which the first electrode 140, the piezoelectric layer 150, and the second electrode 160 overlap one another in the vertical direction above the air cavity 133. The inactive region of the resonant part 155, which is a region that does not resonate by the piezoelectric phenomenon even when the electric energy is applied to the first and second electrodes 140 and 160, corresponds to a region outside the active region.

The resonant part 155 outputs a radio frequency signal having a specific frequency using the piezoelectric phenomenon. For example, the resonant part 155 outputs a radio frequency signal having a resonant frequency corresponding to vibrations depending on the piezoelectric phenomenon of the piezoelectric layer 150.

When the electric energy such as the radio frequency signal is applied to the first electrode 140 and the second electrode 160, an acoustic wave is generated by the piezoelectric phenomenon generated in the piezoelectric layer 150. In this case, a lateral wave is collaterally generated from the generated acoustic wave. When the collaterally generated lateral wave is not trapped, loss of the acoustic wave occurs, and thereby deteriorates a quality factor of the resonator.

Referring to FIG. 6, in a bulk acoustic wave resonator 100-3, an auxiliary electrode 165 is additionally provided along an edge of the active region of the resonant part 155. The edge of the active region refers to a portion in the active region adjacent to a boundary between the active region and the inactive region. The auxiliary electrode 165 may be formed of a material different from that of the second electrode 160.

Alternatively, the auxiliary electrode 165 is formed of the same material as that of the second electrode 160. In an example, the auxiliary electrode 165 and the second electrode 160 have different acoustic impedances. For example, the auxiliary electrode 165 is formed of a material having an acoustic impedance higher than that of the second electrode 160. For example, when the second electrode 160 is formed of ruthenium (Ru), the auxiliary electrode 165 is formed of either one of iridium (Ir) and tungsten (W) having an acoustic impedance higher than that of ruthenium (Ru). Alternatively, the auxiliary electrode 165 is formed of a material having an acoustic impedance lower than that of the second electrode 160. For example, when the second electrode 160 is formed of ruthenium (Ru), the auxiliary electrode 165 is formed of any one of aluminum (Al), gold (Au), nickel (Ni), copper (Cu), titanium (Ti), chromium (Cr), cobalt (Co), manganese (Zn), and magnesium (Mg) having an impedance lower than that of ruthenium (Ru), and is formed of any one of aluminum (Al), gold (Au), nickel (Ni), copper (Cu), cobalt (Co), manganese (Zn), and magnesium (Mg) when considering electrical resistivity.

The auxiliary electrode 165 is additionally provided along the edge of the active region of the resonant part 155 to trap a lateral wave. Therefore, a quality factor of the bulk acoustic wave resonator is improved, and loss of an acoustic wave is reduced. The configuration of the auxiliary electrode 165 may be variously applied to other embodiments disclosed herein.

Figure 7:
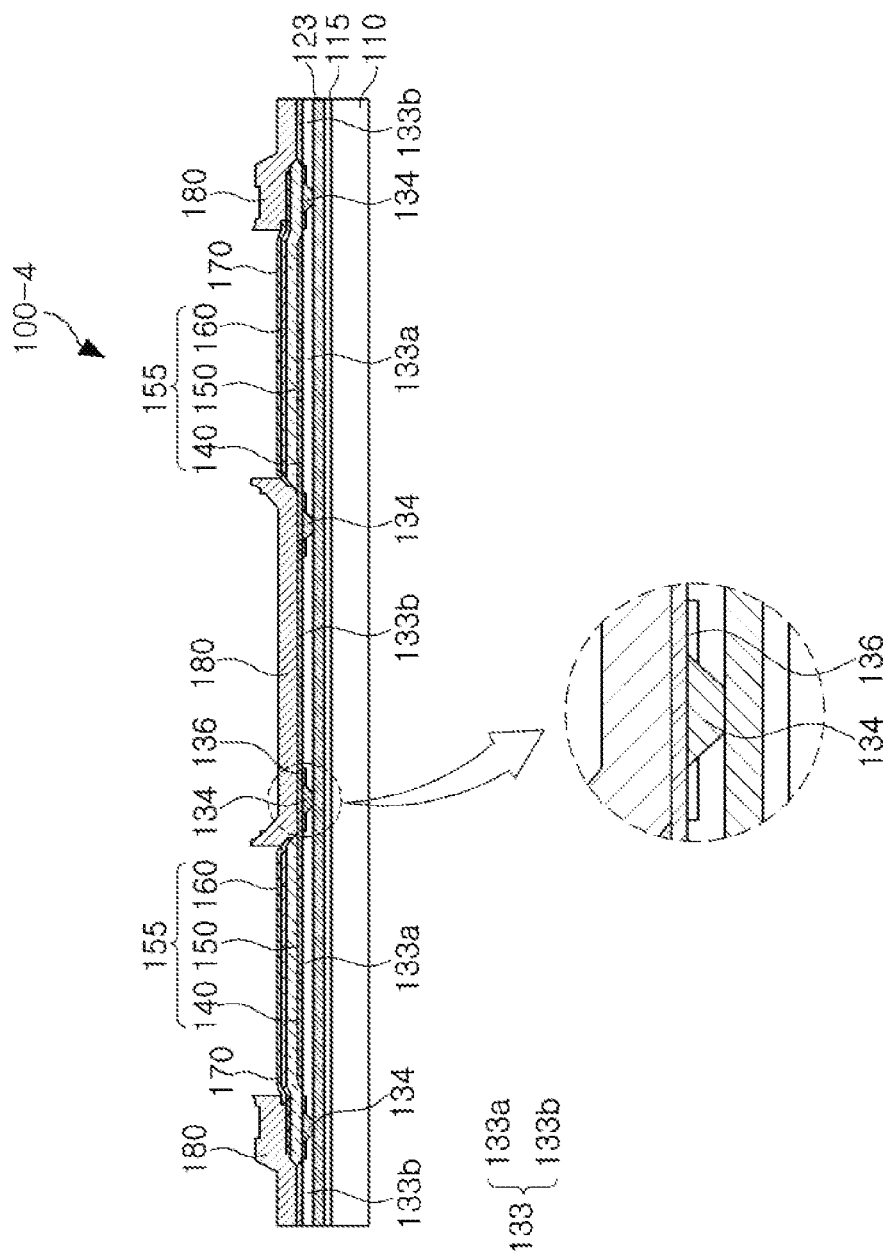

Referring to FIG. 7, in a bulk acoustic wave resonator, 100-4, a frame 136 is provided in the air cavity 133, along a boundary surface of a layer disposed above the air cavity 133. The frame 136 may have a thickness that is less than a thickness of the support member 134. The frame 136 protrudes in a step form from side surfaces of the support member 134. In FIG. 7, the frame 136 extends from opposite sides of the support member 134, but the frame 136 may be disposed to be spaced apart from the support member 134. The frame 136 has, for example, an approximately trapezoidal shape of which a width of an upper surface is greater than a width of a lower surface and side surfaces connecting the upper surface and the lower surface to each other are inclined.

The frame 136 may be formed by the same process as the process by which the support member 134 is formed, and may be formed of the same material as that of the support member 134. As an example, the frame 136 is formed of either one or both of a silicon dioxide ($SiO_2$) and a silicon nitride ($Si_3N_4$).

The frame 136 may be formed of a material having compressive stress and tensile stress, and the bulk acoustic wave resonator 100-4 may thus be resistant to stress acting in an upward direction and a downward direction of the bulk acoustic wave resonator 100-4.

As an example, when the frame 136 is formed of a material having compressive stress, a phenomenon in which layers provided above the air cavity 133 sag downwardly is prevented. In this case, the frame 136 may be formed of a silicon dioxide ($SiO_2$). As another example, when the frame 136 is formed of a material having tensile stress, a phenomenon in which the resonant part 155 is bent toward a portion opposing the air cavity 133 is prevented. In this case, the frame 136 may be formed of a silicon nitride ($Si_3N_4$).

The frame 136 may be formed of a material having an elastic coefficient (hereinafter, referred to as a temperature coefficient of elasticity) that varies depending on a temperature (to reduce a variation in a frequency depending on a temperature change. As an example, a temperature coefficient of elasticity of the frame 136 and a temperature coefficient of elasticity of the resonant part 155 including the first electrode 140, the piezoelectric layer 150, and the second electrode 160 have different signs. When the resonant part 155 has a negative temperature coefficient of elasticity corresponding to −30 to −80 ppm/K, in a case in which a temperature of the resonant part 155 rises by 1 K, elasticity may be reduced by 30 to 80 ppm. The reduction in the elasticity of the resonant part 155 allows a resonant frequency of the bulk acoustic wave resonator to be lowered, which causes deterioration of performance of a filter. In this case, when the frame 136 is formed of a silicon dioxide ($SiO_2$) having a positive temperature coefficient of elasticity of 130 ppm/K, a reduction in elasticity due to an influence of the resonant part 155 is compensated for, and elasticity of the bulk acoustic wave resonator 100-4 increases depending on a rise in a temperature.

An example in which the frame 136 has the positive temperature coefficient of elasticity and the resonant part 155 has the negative temperature coefficient of elasticity is described above. However, the resonant part 155 may have a positive temperature coefficient of elasticity. In such a case, the frame 136 has a negative temperature coefficient of elasticity.

Figure 8:
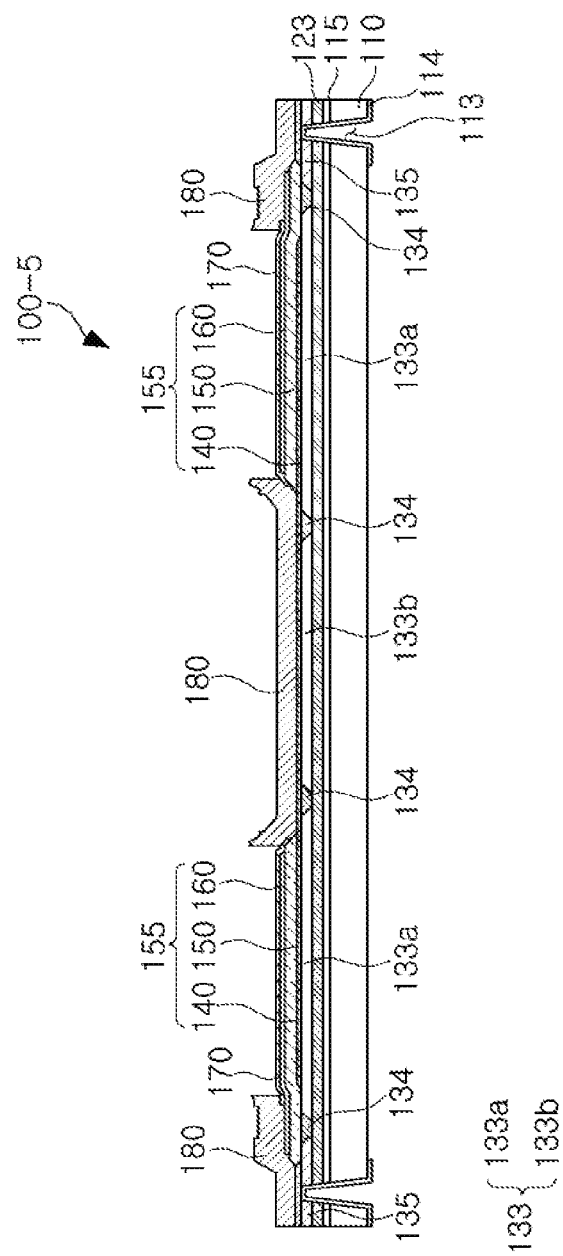

Referring to FIG. 8, in a bulk acoustic wave resonator 100-5, at least one via hole 113 penetrating through the substrate 110 in a thickness direction is formed in a lower surface of the substrate 110, and a connection pattern 114 may be provided in the via hole 113. The via hole 113 penetrates through the insulating layer 115, the etch stop layer 123, and the auxiliary support member 135 in the thickness direction, in addition to the substrate 110.

The connection pattern 114 may be formed over the entire inner surface, that is, the entire inner wall, of the via hole 113. The connection pattern 114 may be manufactured by forming a conductive layer on the inner surface of the via hole 113. For example, the connection pattern 114 is formed by depositing, applying, or filling a conductive metal including any one of gold (Au), copper (Cu), and a titanium (Ti)-copper (u) alloy along the inner wall of the via hole 113.

The connection pattern 114 is connected to either one or both of the first electrode 140 and the second electrode 160. As an example, the connection pattern 114 penetrates through the substrate 110, the insulating layer 115, the etch stop layer 123, and the auxiliary support member 135, and is then electrically connected to either one or both of the first electrode 140 and the second electrode 160. The connection pattern 114 extends to the lower surface of the substrate 110 to be connected to a substrate connection pad provided on the lower surface of the substrate 110. Therefore, the connection pattern 114 electrically connects the first electrode 140 and the second electrode 160 to the substrate connection pad.

The substrate connection pad may be electrically connected to an external substrate that may be disposed below the bulk acoustic wave resonator through a bump. The bulk acoustic wave resonator 100-5 performs a filtering operation of a radio frequency signal by a signal applied to the first and second electrodes 140 and 160 through the substrate connection pad.

In the bulk acoustic wave resonator 100-5, a phenomenon in which the wiring electrode 180 sags downwardly is prevented through the connection pattern 114 penetrating through the auxiliary support member 135 and being connected to the first electrode 140 and the second electrode 160 in a form in which the connecting pattern 114 supports the first electrode 140 and the second electrode 160.

FIGS. 9A through 9E are views illustrating processes of a method of manufacturing the bulk acoustic wave resonator 100 illustrated in FIG. 3, according to an embodiment.

Figure 9A:
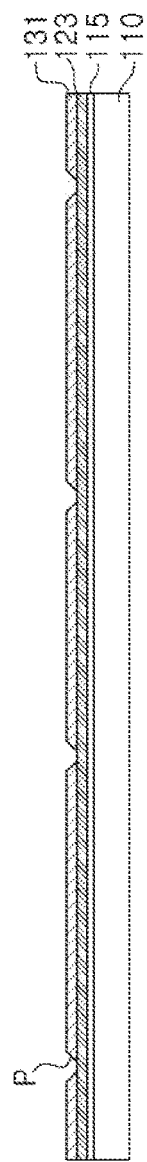
FIGS. 9A through 9E are views illustrating processes of manufacturing the bulk acoustic wave resonator illustrated in FIG. 3.

Referring to FIG. 9A, first, the substrate 110, the insulating layer 115, the etch stop layer 123, and the sacrificial layer 131 are formed, and patterns P are then formed on the sacrificial layer 131. Portions of the etch stop layer 123 are exposed by the patterns P being thicker than the sacrificial layer 131.

Figure 9B:
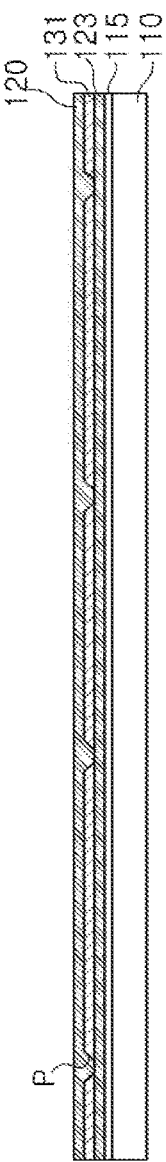

Referring to FIG. 9B, after the patterns are formed on the sacrificial layer 131, an etch stop material 120 is formed to cover the sacrificial layer 131 and portions of the etch stop layer 123 that are externally exposed by the patterns. The patterns P are filled by the etch stop material 120, and the etch stop layer 123 and the etch stop material 120 may be formed of the same material.

Figure 9C:
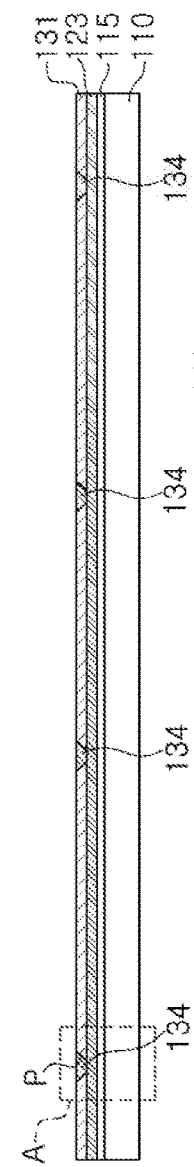

Referring to FIG. 9C, after the etch stop material 120 is formed, one surface of the etch stop material 120 is planarized so that the sacrificial layer 131 is externally exposed. Portions of the etch stop material 120 are removed in the process of planarizing the one surface of the etch stop material 120, and the support members 134 are formed by portions of the etch stop material 120 remaining in the patterns P after portions of the etch stop material 120 are removed. As a result of the process of planarizing the one surface of the etch stop material 120, one surface provided by the sacrificial layer 131 and the support member 134 is approximately flat.

Figure 10:
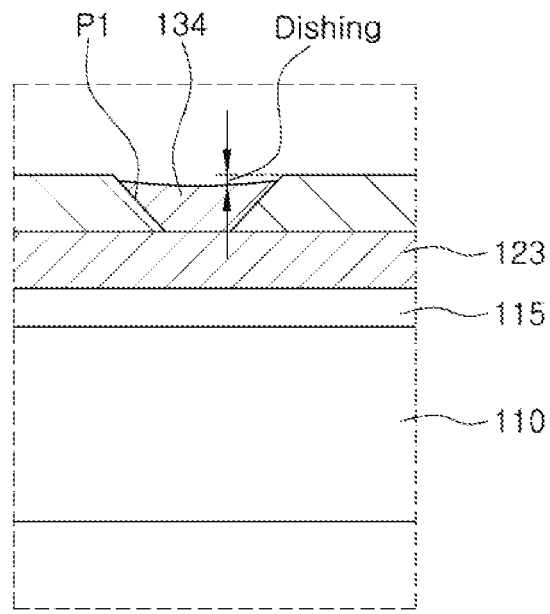
FIG. 10 is an enlarged view of part A of FIG. 9C.

FIG. 10 is an enlarged view of part A of FIG. 9C. Referring to FIG. 10, with respect to the support member 134 remaining after a portion of the etch stop material 120 is removed, a dishing phenomenon, in which an upper surface of the support member 134 is concavely indented by a step of the pattern P, may occur. More specifically, a thickness of the center of the upper surface of the support member 134 may be less than a thickness of an edge of the upper surface of the support member 134.

Side surfaces of the pattern P in which the support member 134 is provided are inclined to prevent an abrupt step from being formed on a boundary between the support member 134 and the sacrificial layer 131, and the pattern P has a smaller width in a lower surface thereof than in an upper surface thereof to prevent occurrence of the dishing phenomenon. For example, an angle formed by the lower surface and the side surface of the pattern P is 110° to 160°.

Figure 9D:
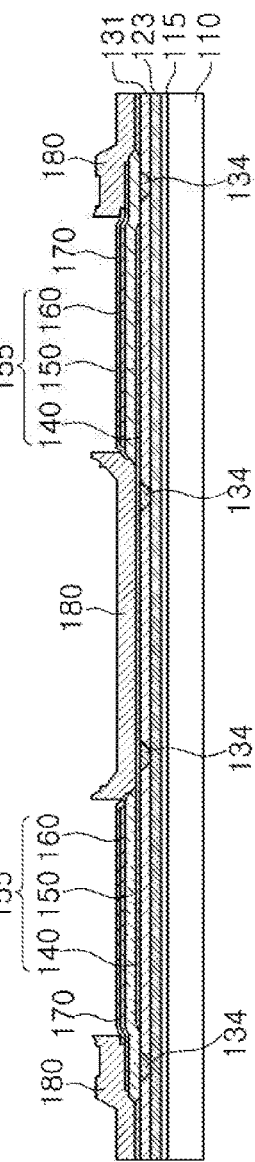
Figure 9E:
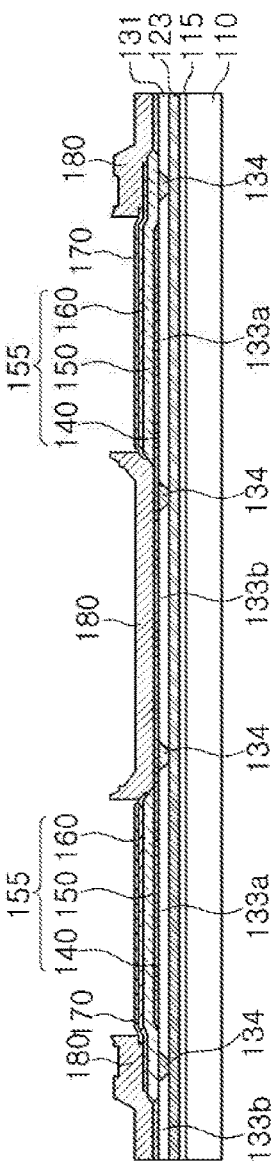

Referring to FIG. 9D, after portions of the etch stop material 120 are removed, the first electrode 140, the piezoelectric layer 150, and the second electrode 160 are sequentially stacked on the approximately flat surface provided by the sacrificial layer 131 and the support members, the protecting layer 170 is disposed on the second electrode 160, and the wiring electrode 180 is formed on the externally exposed portions of the first electrode 140 and the second electrode 160. Then, as illustrated in FIG. 9E, the sacrificial layer 131 is removed by the etching process, such that the air cavity 133 including the first air cavity 133a and the second air cavity 133b is formed.

Figure 11:
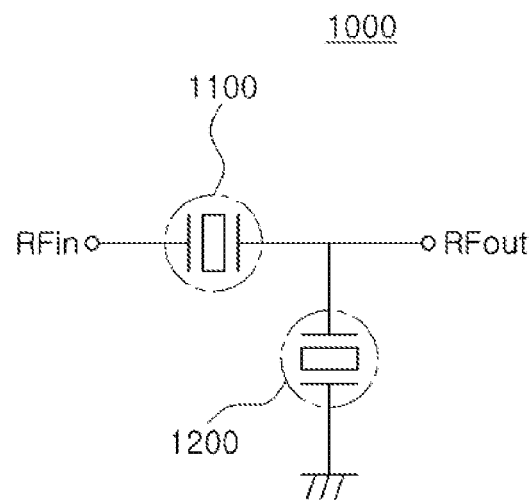
FIGS. 11 and 12 are schematic circuit diagrams of filters, according to embodiments.
Figure 12:
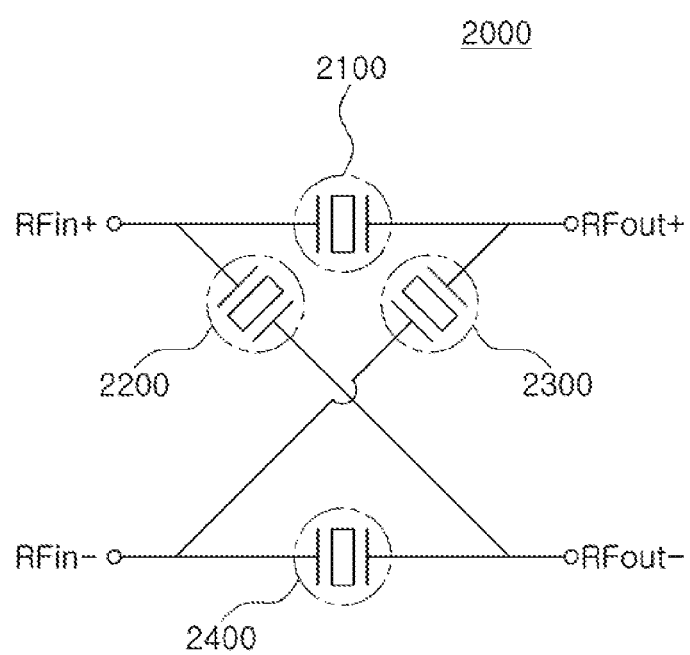

FIGS. 11 and 12 are schematic circuit diagrams of filters, according to embodiments. Bulk acoustic wave resonators used in the filters of FIGS. 11 and 12 may correspond to the bulk acoustic wave resonators of the various embodiments disclosed herein.

Referring to FIG. 11, a filter 1000 is formed in a ladder type filter structure. In detail, the filter 1000 includes first and second bulk acoustic wave resonators 1100 and 1200.

The first bulk acoustic wave resonator 1100 is connected between a signal input terminal to which an input signal RFin is input and a signal output terminal from which an output signal RFout is output, in series. The second bulk acoustic wave resonator 1200 is connected between the signal output terminal and a ground.

Referring to FIG. 12, a filter 2000 is formed in a lattice type filter structure. In detail, the filter 2000 includes first, second, third, and fourth bulk acoustic wave resonators 2100, 2200, 2300, and 2400, and filters balanced input signals RFin+ and RFin− and outputs balanced output signals RFout+ and RFout−.

As set forth above, in bulk acoustic wave resonators according to embodiments disclosed herein, formation of cracking in a film or a layer stacked on a substrate is prevented, and normal crystal growth is induced.

In addition, in bulk acoustic wave resonators according to the embodiments disclosed herein, a variation in a frequency depending on a temperature change is reduced, and the bulk acoustic wave resonators are resistant to stress acting in an upward direction and a downward direction.

In addition, a parasitic capacitance component below a wiring electrode is reduced.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic wave resonator, comprising:
   a substrate;
   support members disposed on an upper surface of the substrate such that the support members are respectively disposed between air cavities that are disposed above the substrate;
   a resonant part comprising a first electrode, a piezoelectric layer, and a second electrode sequentially disposed above the air cavities and on the support members;
   a wiring electrode connected either one or both of the first electrode and the second electrode, and disposed above one of the air cavities; and
   a frame disposed in each of the air cavities and extending from side surfaces of a support member, among the support members,
   wherein a thickness of the frame is less than a thickness of the support member.

2. The bulk acoustic wave resonator of claim 1, wherein the frame extends along a boundary surface of the resonant part.

3. The bulk acoustic wave resonator of claim 1, wherein the support members are formed of either one or both of a silicon dioxide and a silicon nitride.

4. The bulk acoustic wave resonator of claim 1, wherein the frame is formed of a material comprising either one or both of a tensile stress and a compressive stress.

5. The bulk acoustic wave resonator of claim 1, wherein the frame and the resonant part comprise temperature coefficients of elasticity of which signs are different from each other.

6. The bulk acoustic wave resonator of claim 1, further comprising an auxiliary support member disposed in the one of the air cavities,
   wherein the auxiliary support member and the support members are formed of a same material.

7. The bulk acoustic wave resonator of claim 1, further comprising an auxiliary support member disposed in the one of the air cavities,
   wherein the auxiliary support member comprises polysilicon.

8. The bulk acoustic wave resonator of claim 1, wherein a width of an upper surface of the support members is greater than a width of a lower surface of the support members, and side surfaces of the support members connecting the upper surface and the lower surface to each other are inclined.

* * * * *